(12) United States Patent
Disney

(10) Patent No.: US 9,059,329 B2
(45) Date of Patent: Jun. 16, 2015

(54) POWER DEVICE WITH INTEGRATED SCHOTTKY DIODE AND METHOD FOR MAKING THE SAME

(75) Inventor: Donald R. Disney, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 106 days.

(21) Appl. No.: 13/215,116

(22) Filed: Aug. 22, 2011

(65) Prior Publication Data

US 2013/0049076 A1   Feb. 28, 2013

(51) Int. Cl.
  *H01L 27/06*   (2006.01)
  *H01L 29/872*  (2006.01)
  *H01L 27/07*   (2006.01)
  *H01L 29/808*  (2006.01)

(52) U.S. Cl.
  CPC ........ *H01L 29/8725* (2013.01); *H01L 27/0727* (2013.01); *H01L 29/808* (2013.01); *H01L 29/872* (2013.01)

(58) Field of Classification Search
  CPC ................ H01L 2924/00014; H01L 2924/00; H01L 29/41766; H01L 29/7813; H01L 2924/19041; H01L 29/0696; H01L 2224/48137; H01L 27/0629; H01L 27/088; H01L 29/66727; H01L 29/66734; H01L 29/7827; H01L 29/80
  USPC ............... 257/272, 332, E29.021, E29.027, 257/E29.121, E29.258, E29.262, E29.318, 257/330, 333, 368; 438/570
  See application file for complete search history.

(56) References Cited

U.S. PATENT DOCUMENTS

| 5,528,074 | A  | * | 6/1996  | Goto et al. ........... 257/664 |
| 5,982,250 | A  | * | 11/1999 | Hung et al. ........... 333/26 |
| 6,040,739 | A  | * | 3/2000  | Wedeen et al. ........ 330/66 |
| 6,600,194 | B2 | * | 7/2003  | Hueting et al. ........ 257/331 |
| 7,095,292 | B2 | * | 8/2006  | Sayanagi et al. ....... 333/26 |
| 7,217,957 | B2 | * | 5/2007  | Kuhara et al. ......... 257/98 |
| 7,388,450 | B2 | * | 6/2008  | Camiade et al. ....... 333/26 |
| 7,928,509 | B2 |   | 4/2011  | Huang |
| 8,081,044 | B2 | * | 12/2011 | Ligander ............ 333/26 |
| 8,148,233 | B2 | * | 4/2012  | Grebs et al. .......... 438/401 |
| 8,304,825 | B2 | * | 11/2012 | Garnett ............... 257/302 |
| 2007/0164420 | A1 | * | 7/2007 | Chen et al. ........... 257/691 |
| 2009/0159320 | A1 | * | 6/2009 | Sanjuan et al. ........ 174/260 |
| 2009/0206473 | A1 | * | 8/2009 | Lopez et al. .......... 257/728 |
| 2010/0258897 | A1 | * | 10/2010 | Lui et al. ............ 257/471 |
| 2012/0051000 | A1 | * | 3/2012 | Laidig et al. ......... 361/736 |
| 2012/0104555 | A1 | * | 5/2012 | Bobde et al. .......... 257/587 |
| 2012/0139099 | A1 | * | 6/2012 | Lopez et al. .......... 257/728 |
| 2012/0306043 | A1 | * | 12/2012 | Pan et al. ............ 257/471 |
| 2013/0001699 | A1 | * | 1/2013 | Tai et al. ............ 257/368 |

OTHER PUBLICATIONS

U.S. Appl. No. 12/980,143, filed Dec. 28, 2010.

* cited by examiner

*Primary Examiner* — Stephen W Smoot
*Assistant Examiner* — Edward Chin
(74) *Attorney, Agent, or Firm* — Perkins Coie LLP

(57) ABSTRACT

The present invention discloses a power device with integrated power transistor and Schottky diode and a method for making the same. The power device comprises a power transistor having a drain region, a Schottky diode in the drain region of the power transistor, and a trench-barrier near the Schottky diode. The trench-barrier is provided to reduce a reverse leakage current of the Schottky diode and minimizes the possibility of introducing undesired parasitic bipolar junction transistor in the power device.

10 Claims, 6 Drawing Sheets

POWER DEVICE WITH INTEGRATED SCHOTTKY DIODE AND METHOD FOR MAKING THE SAME

TECHNICAL FIELD

This disclosure relates generally to semiconductor devices, and particularly relates to high-voltage junction field effect transistors with integrated Schottky diodes.

BACKGROUND

Power device comprising a power transistor and a Schottky diode integrated with the power transistor is often required in power management circuits. FIG. 1A illustrates a simple power conversion circuit 100 configured on the basis of a power device comprising a power transistor 101 and a Schottky diode 103 connected in series to convert an input voltage Vin to an output voltage Vo. The power transistor 101 comprises, for example, a junction field effect transistor (JFET) having a gate (G) connected to ground. Thus a complicated control circuit is not required. However, the JFET is a normally-ON device that conducts current in either direction from drain (D) to source (S) or from source (S) to drain (D). Therefore, without the Schottky diode 103, when the output voltage Vo is higher than the input voltage Vin, a current flows reversely from Vo to Vin. The Schottky diode 103 is provided for blocking this reverse current flow.

FIG. 1B shows a diagram illustrating a current ($I_{IN}$) through Schottky diode 103 and JFET 101 as a function of Vin, assuming the gate and the source of JFET 101 are grounded. When the input voltage Vin is higher than a forward conduction voltage $V_F$ of the Schottky diode 103, the current $I_{IN}$ flows from the input Vin to the output Vo through the forward biased Schottky diode 103 and the normally-ON JFET 101. As Vin increases further, the JFET 101 may "pinch off" at a certain voltage ($V_P$) such that the current $I_{IN}$ remains substantially constant for higher values of Vin. In a typical application, the output voltage Vo is not grounded, but rather is used to power a next-stage circuit. In such configuration, Vo rises with increasing Vin up to $V_P$, and then remains relatively constant. Thus, JFET 101 passes a current from Vin to the next-stage circuit while blocks high voltages (voltages higher than $V_P$) which may damage the next-stage circuit. When Vin reaches a forward breakdown voltage ($V_{BF}$) of the JFET 101, a large current flows from Vin to the gate of JFET 101 and/or to Vo. When Vin is negative with respect to Vo, the current $I_{IN}$ turns to be an off-state leakage current ($T_{OFF}$) flowing from Vo to Vin. When the negative Vin voltage exceeds a breakdown voltage ($V_{BR}$) of the Schottky diode 103, a high current flows from Vo to Vin.

FIG. 2 illustrates a sectional view of a prior art power device 200 integrating a JFET 202 and a Schottky diode 204. The power device 200 has a p-type substrate 206. An n-type well region 208 is formed on the p-type substrate 206. The JFET 202 and the Schottky diode 204 share the same p-type substrate 206 and the same n-type well region 208. A p-type doped region 210 is provided in the n-type well region 208 to form a gate region of the JFET 202 and a $p^+$ heavily doped region 212 is formed in the p-type doped region 210 to function as an ohmic contact for the gate region 210. The n-type well region 208 at the left side of the gate region 210 forms a drain region of the JFET 202 and the n-type well region 208 at the right side of the gate region 210 forms a source region of the JFET 202. An $n^+$ heavily doped region 214 is provided in the n-well region 208 at the right side of the gate region 210 to form an ohmic contact of the source region. A drain metal 216, a gate metal 218 and a source metal 220 functioning respectively as a drain electrode D, a gate electrode G and a source electrode S of the combined power device 200 are formed to respectively contact the drain region, the $p^+$ heavily doped region 212 and the $n^+$ heavily doped region 214.

The Schottky diode 204 comprises a cathode sharing the n-type well region 208 and an anode sharing the drain metal 216. The Schottky diode 204 further comprises $p^+$ heavily doped regions 222 provided on both sides of Schottky diode 204. P+ regions 222 are used to form a merged PN Schottky (MPS) diode, which reduces a reverse leakage current of the Schottky diode 204. Without the $p^+$ heavily doped region 222, the reverse leakage current of the Schottky diode 204 may be unacceptably high.

However, the $p^+$ heavily doped region 222 may cause a problem when the power device 200 is in ON state and the Schottky diode 204 is forward biased. In fact, there exists a parasitic bipolar junction transistor (BJT) which uses the $p^+$ heavily doped region 222, the n-type well region 208 and the p-type substrate 206 as an emitter, a base and a collector, respectively. At high forward current, the junction between the $p^+$ heavily doped region 222 and the n-type well region 208 may be forward biased, causing the parasitic bipolar transistor to turn ON. In this case, carriers may be injected into the substrate 206 and disturb the operation of other circuits that are integrated with the power device 200, which is undesirable.

SUMMARY

In one embodiment, a power device, comprises a semiconductor substrate; a power transistor formed in the semiconductor substrate, wherein the power transistor comprises a drain region, a source region, a gate region, and a drain metal coupled to the drain region; a trench-barrier formed in the drain region of the power transistor, wherein the trench-barrier comprises a first trench and a second trench separated by a portion of the drain region; and a Schottky diode formed between the first and the second trenches, wherein the Schottky diode has an anode comprising the drain metal and a cathode comprising a portion of the drain region of the power transistor.

In one embodiment, a power device comprises a semiconductor substrate of a first conductivity type; a well region of a second conductivity type formed in the substrate; a gate region of the first conductivity type formed in the well region; a first trench and a second trench formed in the well region, wherein the first trench and the second trench are separated by a portion of the well region; and a drain metal contacting the portion of the well region between the first and the second trenches to form a metal-semiconductor contact.

In one embodiment, a method of forming a power device integrating a power transistor and a Schottky diode comprises providing a semiconductor substrate; forming the power transistor in the semiconductor substrate, wherein, forming the power transistor comprises forming a drain region, a gate region and a source region in the semiconductor substrate; forming a trench-barrier in the drain region of the power transistor, wherein forming the trench-barrier comprises forming a first trench and a second trench separated by a portion of the drain region; and forming the Schottky diode in the drain region of the power transistor, wherein forming the Schottky diode comprises forming a drain metal to contact the portion of the drain region between the first and the second trenches of the trench-barrier.

In one embodiment, a method of manufacturing a power device comprises providing a semiconductor substrate of a first conductivity type; forming a well region of a second conductivity type on the substrate; forming a gate region of the first conductivity type in the well region; forming a first trench and a second trench in the well region, wherein the first trench and the second trench are separated by a portion of the well region; and forming a drain metal to contact the portion of the well region between the first and the second trenches.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features.

The use of the same reference label in different drawings indicates the same or like components.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the technology can be practiced without one or more specific details, or with other methods, components, materials, etc. In other instances, well-known structures, materials, processes or operations are not shown or described in detail to avoid obscuring aspects of the technology.

The terms "left," "right," "in," "out," "front," "back," "up," "down," "top," "atop", "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the present invention described herein are, for example, capable of operation in other orientations than those illustrated or otherwise described herein. The term "coupled," as used herein, is defined as directly or indirectly connected in an electrical or non-electrical manner.

A power device integrating a power transistor and a Schottky diode with a trench-barrier is disclosed. In accordance with an embodiment of the present invention, the power device comprises a semiconductor substrate; a power transistor formed in the semiconductor substrate, wherein the power transistor comprises a drain region, a source region, a gate region, and a drain metal coupled to the drain region; a trench-barrier formed in the drain region of the power transistor, wherein the trench-barrier comprises a first trench and a second trench separated by a portion of the drain region; and a Schottky diode formed between the first and the second trenches, wherein the Schottky diode has an anode comprising the drain metal and a cathode comprising a portion of the drain region of the power transistor.

In one embodiment, the first and the second trenches are filled with a conductive material, and the conductive material is separated from the drain region of the power transistor by a dielectric material.

In other embodiment, the first trench and the second trench have sidewalls and bottoms lined with a dielectric material.

In still other embodiment, the drain metal contacts the conductive material of the first and the second trenches.

Figure 1A:
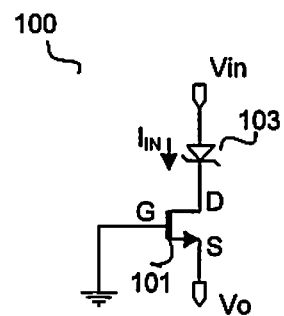
FIG. 1A shows a schematic diagram of a prior art power conversion circuit 100.
Figure 1B:
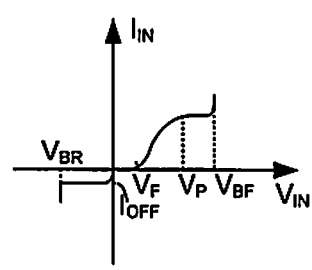
FIG. 1B shows a diagram illustrating a current-voltage relationship of the prior art power conversion circuit in FIG. 1A.
Figure 2:
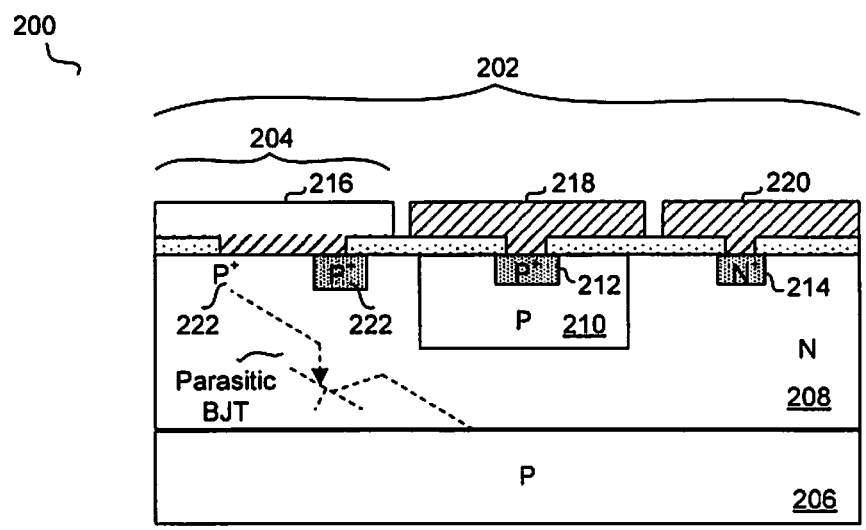
FIG. 2 shows a sectional view of a prior art power device 200 integrating a JFET and a merged PN Schottky diode.

According to various embodiments of the present invention, the Schottky diode with a trench-barrier has a rather small reverse leakage current and blocks current from flowing in an undesired direction in the power device while allow current flow in a desired direction when a relatively low series voltage that is higher than the forward conduction voltage (about 0.3V) of the Schottky diode is additionally applied to the power device. Thus, the power device having an integrated Schottky diode with a trench-barrier in accordance with various embodiments of the present invention conducts a current in a desired direction and blocks a reverse current in an undesired direction. In addition, the power device in accordance with various embodiments of the present invention does not comprise a parasitic bipolar junction transistor as the prior art power device of FIG. 1. Therefore, the power device integrating a power transistor and a Schottky diode with a trench-barrier according to the present invention greatly reduces or eliminates the potential problem of carrier injection into the substrate which may disturb the operation of other circuitry integrated with the power device.

Figure 3A:
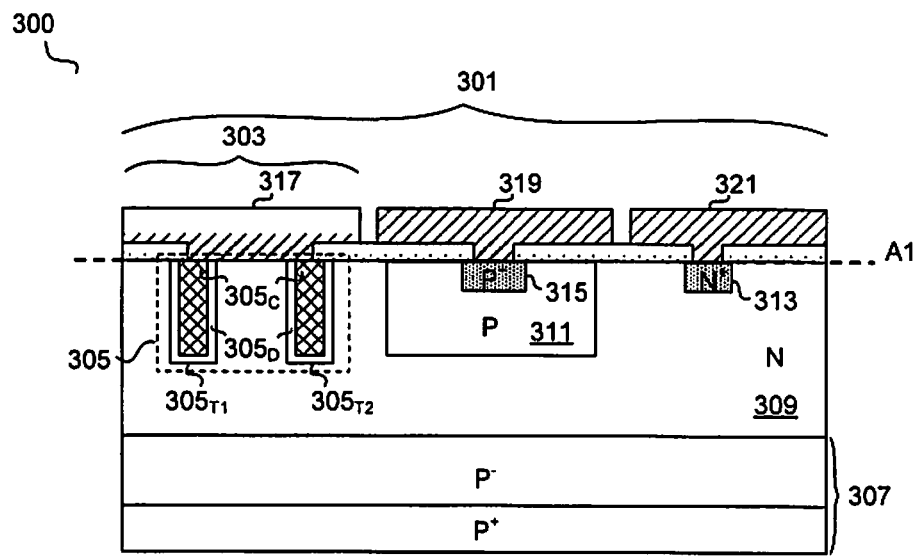
FIG. 3A shows a sectional view of a power device 300 in accordance with an embodiment of the present invention.

FIG. 3A illustrates a sectional view of a power device 300 in accordance with an embodiment of the present invention. In the example of FIG. 3A, the power device 300 comprises a JFET 301, a Schottky diode 303 and a trench-barrier 305. In one embodiment, power device 300 has a p-type substrate 307 that may comprise a $p^+$ substrate layer and a $p^-$ epitaxial layer. Power device 300 further has an n-type well region 309 atop the p-type substrate 307. N-type well region 309 may have a p-type doped region 311. It can be understood that, p-type doped region 311 may function as a gate region of JFET 301, n-type well region 309 at the left side of p-type doped region 311 may function as a drain region of JFET 301, and n-type well region 309 at the right side of p-type doped region 311 may function as a source region of JFET 301.

In one embodiment, n-type well region 309 at the right side of p-type doped region 311 may further have an $n^+$ heavily doped region 313 near its top surface A1. $N^+$ heavily doped region 313 may function as an ohmic contact for the source region of JFET 301. P-type doped region 311 may further have a $p^+$ heavily doped region 315 near the top surface A1. $P^+$ heavily doped region 315 may function as an ohmic contact for the gate region of JFET 301. Power device 300 further has a drain metal 317, a gate metal 319 and a source metal 321 functioning respectively as a drain electrode D, a gate electrode G and a source electrode S of power device 300 and contacting the drain region, the $p^+$ heavily doped region 315 and the $n^+$ heavily doped region 313, respectively.

JFET 301 and Schottky diode 303 share the same p-type substrate 307 and the same n-type well region 309. Schottky diode 303 comprises a cathode sharing the n-type well region 309 and an anode sharing the drain metal 317 so that a metal-semiconductor contact is formed.

Trench-barrier 305 is formed near the Schottky diode 303 for blocking a reverse leakage current of the Schottky diode 303. Trench-barrier 305 comprises a first trench $305_{T1}$ and a second trench $305_{T2}$ formed in the n-type well region 309, wherein, the first trench $305_{T1}$ and the second trench $305_{T2}$ are respectively at the left side and the right side of Schottky diode 303. The first trench $305_{T1}$ and the second trench $305_{T2}$ are lined with a dielectric material $305_D$ on their sidewalls and bottoms, and are filled with a conductive material $305_C$ adjacent the dielectric material $305_D$. Conductive material $305_C$ is coupled to the drain metal 317. In one embodiment, conductive material $305_C$ partly contacts the drain metal 317.

In one embodiment, dielectric material $305_D$ may comprise silicon dioxide. In one embodiment, conductive material $305_C$ may comprise doped polysilicon.

Figure 3B:
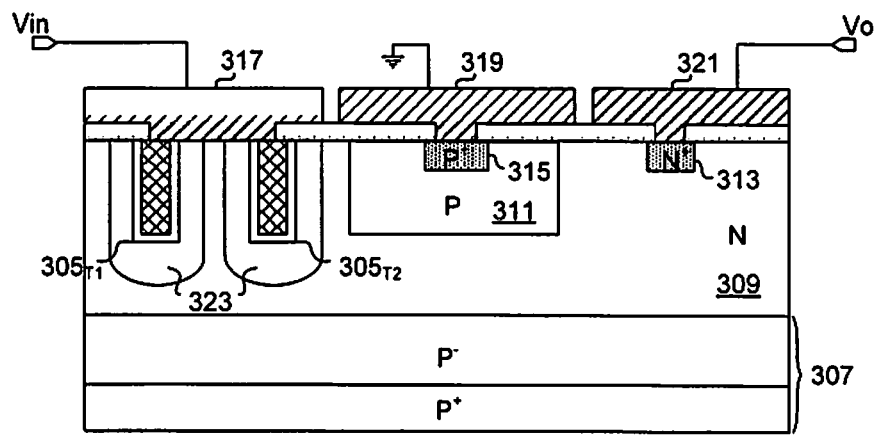
FIG. 3B shows an exemplary configuration of the power device 300 in FIG. 3A when it is used to convert an input voltage Vin to an output voltage Vo.

FIG. 3B shows an exemplary configuration of the power device 300 when it is used to convert an input voltage Vin to an output voltage Vo, The drain metal 317 is coupled to Vin, the gate metal 319 is coupled to ground and the source metal 321 is coupled as an output terminal for Vo. When the input voltage Vin is higher than a forward conduction voltage of the Schottky diode 303, power device 300 starts to conduct a current flowing from the drain to the source of JFET 301 (i.e., from Vin to Vo). Since trench-barrier 305 is formed in trenches $305_{T1}$ and $305_{T2}$, and conductive material $305_C$ which fills the trenches $305_{T1}$ and $305_{T2}$ is isolated from the n-well region 309 by dielectric material $305_D$, and thus reducing the formation of a parasitic bipolar junction transistor in power device 300, and further, carrier injection into the n-well region 309 from conductive material $305_C$ is prevented. Thus, power device 300 integrating a JFET and a Schottky diode with trench-barrier may not have the potential problem of injecting carriers into the substrate when power device 300 is in conduction state and the Schottky diode 303 is forward biased.

When the output voltage Vo is higher than the input voltage Vin, the Schottky diode 303 shifts from forward biasing to reverse biasing. Since there are only electrons participating in the current flow, the reverse recovery time of the Schottky diode 303 is very short. As the cathode-to-anode voltage of the Schottky diode 303 becomes more positive with Vo increasing, depletion regions 323 start to form in the n-well region 309 around the first and the second trenches $305_{T1}$ and $305_{T2}$. According to an embodiment, the space between the trenches $305_{T1}$ and $305_{T2}$ is designed to allow the depletion regions 323 to be merged at a relatively low voltage (e.g. 1~10V). Once the depletion regions 323 are merged, the voltage across the Schottky diode 303 remains relatively constant, and the Schottky diode 303 is shielded from further increase in the output voltage Vo.

Therefore, trench-barrier 305 not only greatly reduces the reverse leakage current of Schottky diode 303, but also supports a higher breakdown voltage of Schottky diode 303 in a relatively small cathode area. Moreover, trench barrier 305 helps to minimize or eliminate the forming possibility of a parasitic bipolar junction transistor in power device 300 and significantly reduces or eliminates carriers that may be injected into the substrate of power device 300.

In one embodiment, power device 300 may have asymmetric blocking capability, which means that power device 300 may support much more voltage from drain electrode 317 to source electrode 321 and/or gate electrode 319 than from source electrode 321 and/or gate electrode 317 to drain electrode 317. To achieve this asymmetric blocking capability, the length of the portion of N-well region 309 between trench barrier 305 and gate region 311 is substantially longer than the length of the portion of N-well region 309 between gate region 311 and source region 313.

Although in the embodiments described based on FIGS. 3A and 3B power device 300 is disclosed as having a JFET 301 integrated with the Schottky diode 303 and the trench-barrier 305. In various embodiments of the present invention, power device 300 may have other types of power transistors such as metal oxide semiconductor field effect transistor (MOSFET) and bipolar junction transistor etc., instead of the JFET 301, integrated with the Schottky diode 303 and the trench-barrier 305.

Figure 4A:
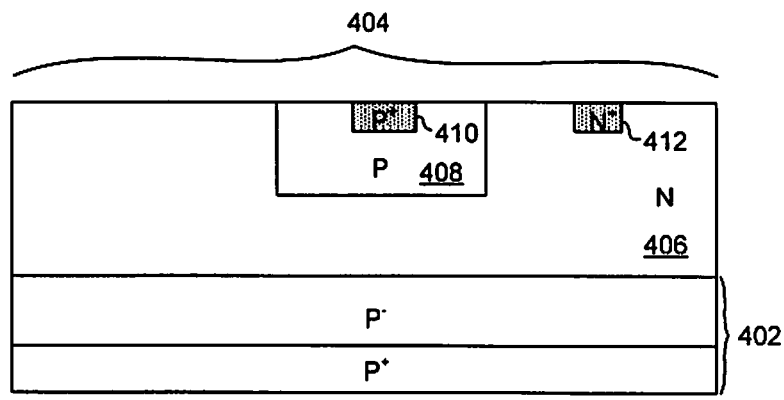
FIGS. 4A to 4C show sectional views of a fabrication process of a power device in accordance with an embodiment of the present invention.
Figure 4B:
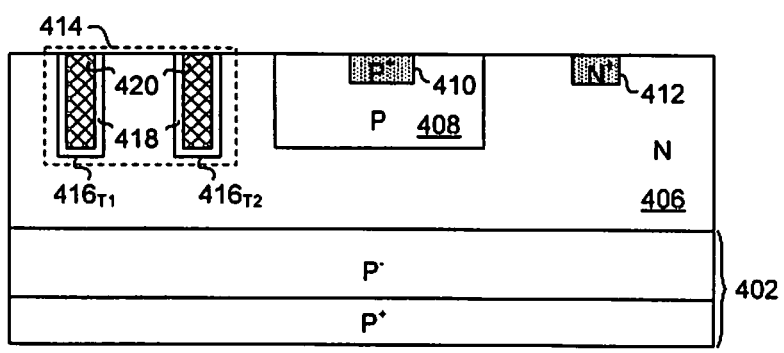
Figure 4C:
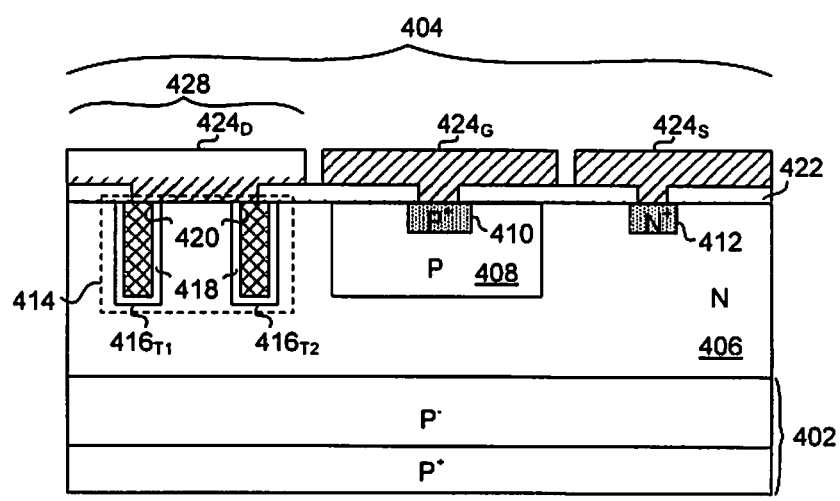

FIGS. 4A to 4C show a fabrication process of a power device with integrated power transistor and trench-barrier Schottky diode in accordance with an embodiment of the present invention.

As shown in FIG. 4A, at a first step, a semiconductor substrate 402 is originally provided and in the following steps a power transistor 404 is fabricated on the semiconductor substrate 402. In one embodiment, the semiconductor substrate 402 may comprise a p-type substrate. In one embodiment, the p-type substrate may comprise a $p^+$ substrate layer and a p" epitaxial layer formed on the $p^+$ substrate layer. In one embodiment, the power transistor 404 may comprise an n-channel JFET. Forming the n-channel JFET 404 may comprise: forming an n-type well region 406 on the semiconductor substrate 402; and forming a p-type gate region 408 in the n-type well region 406. In one embodiment, forming the n-channel JFET 404 may further comprise: forming a $p^+$ heavily doped region 410 in the p-type gate region 408; and forming an $n^+$ heavily doped region 412 in the n-type well region 406 at one side of the gate region 408.

In the next step, as illustrated in FIG. 4B, a trench-barrier 414 is formed in the n-type well region 406. In one embodiment, forming the trench-barrier 414 may comprise: forming a first trench $416_{T1}$ and a second trench $416_{T2}$ in the n-type well region 406 at the other side of the gate region 408; forming a dielectric material 418 on the sidewalls and the bottoms of the first and the second trenches $416_{T1}$ and $416_{T2}$; and filling the first and the second trenches $416_{T1}$ and $416_{T2}$ with a conductive material 420. In one embodiment, dielectric material 418 may comprise silicon dioxide. In one embodiment, conductive material 420 may comprise doped polysilicon.

In the next step, as illustrated in FIG. 4C, a dielectric layer 422 is formed on the n-well region 406 and is etched to expose the $p^+$ heavily doped region 410, the $n^+$ heavily doped region 412, the n-well region 406 between the first trench $416_{T1}$ and the second trench $416_{T2}$, and a portion of the conductive material 420. Then, a metal layer 424 is applied on the dielectric layer 422 and etched into a drain metal $424_D$, a gate metal $424_G$ and a source metal $424_S$ which respectively functions as a drain electrode, a gate electrode and a source electrode of the power transistor 404. Drain metal $424_D$, gate metal $424_G$ and source metal $424_S$ respectively contacts the exposed n-well region 406 and conductive material 420, the exposed $p^+$ heavily doped region 410 and the exposed $n^+$ heavily doped region 412. At this point, a Schottky diode 428 is also formed between the first trench $416_{T1}$ and the second trench $416_{T2}$, using the drain metal $424_D$ as an anode and the n-well region 406 as a cathode.

The fabrication process illustrated in FIGS. 4A to 4C is for illustration purpose and does not limit the present invention to the precise embodiments described. In other embodiments, the semiconductor substrate 402 may comprise an n-type substrate and the power transistor 404 may comprise a p-channel JFET. In still other embodiments, the power transistor 404 may comprise other types of power transistors such as MOSFET or BJT ect. Moreover, well known manufacturing steps, processes, materials and dopants etc. are not described in detail in the present disclosure to avoid obscuring aspects of the technology. Those skilled in the art should understand that the steps described in the embodiment shown may be implemented in different orders and are not limited to the embodiment described.

Figure 5:
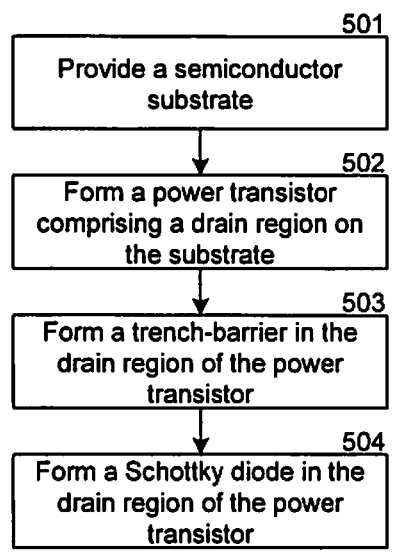
FIG. 5 shows a flow chart illustrating a method of forming a power device in accordance with an embodiment of the present invention.

FIG. 5 shows a flow chart illustrating a method of forming a power device integrating a power transistor and a Schottky diode. The method comprises: providing a semiconductor substrate at step 501; forming a power transistor on the substrate at step 502, wherein forming the power transistor comprises forming a drain region, a gate region and a source region on the substrate; forming a trench-barrier in the drain region of the power transistor at step 503; and forming a Schottky diode in the drain region of the power transistor at step 504.

In an embodiment, forming the power transistor at step 502 comprises forming a drain region, a gate region and a source region on the substrate. In an embodiment, forming the trench-barrier at step 503 comprises forming a first trench and a second trench separated by a portion of the drain region of the power transistor, wherein the first and the second trenches have sidewalls and bottoms. In an embodiment, forming the Schottky diode at step 504 comprises forming a drain metal to contact the portion of the drain region between the first trench and the second trench of the trench-barrier.

In an embodiment, forming the trench-barrier at step 503 further comprises: forming a dielectric material on the sidewalls and bottoms of the first and the second trenches; and filling the first and the second trenches with a conductive material.

Although the present disclosure takes an N-channel JFET for example to explain the structures and manufacturing processes of a power device with integrated power transistor and Schottky diode, this is not intended to be limiting and persons of skill in the art will understand that the structures and principles taught herein also apply to P-channel JFET, N-channel/P-channel MOSFET and to other types of semiconductor materials and devices as well. While poly-silicon is preferred for filling the trenches used in embodiments of the present invention, the embodiments are not limited to this choice of conductor and other types of materials (e.g., metals, other semiconductors, semi-metals, and/or combinations thereof) that are compatible with other aspects of the device manufacturing process may also be used. Thus, the terms "poly-filled" and "poly-silicon filled" are intended to include such other materials and material combinations in addition to silicon.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

I claim:

1. A power device, comprising: a semiconductor substrate; a power transistor formed in the semiconductor substrate, wherein the power transistor comprises a drain region, a source region, a gate region, and a drain metal coupled to the drain region; a trench-barrier formed in the drain region of the power transistor, wherein the trench-barrier comprises a first trench and a second trench separated by a portion of the drain region; and wherein the first and the second trenches are filled with a conductive material, and wherein the conductive material is separated from the drain region of the power transistor by a dielectric material, and wherein the drain metal contacts the conductive material of the first and the second trenches; and a Schottky diode formed between the first and the second trenches, wherein the Schottky diode has an anode comprising the drain metal and a cathode comprising a portion of the drain region of the power transistor, and wherein the trench-barrier is configured to block a reverse leakage current of the Schottky diode.

2. The power device of claim 1, wherein the first and the second trenches have sidewalls and bottoms lined with the dielectric material.

3. A power device, comprising: a semiconductor substrate of a first conductivity type; a well region of a second conductivity type formed in the substrate; a gate region of the first conductivity type formed in the well region; a first trench and a second trench formed in the well region, wherein the first trench and the second trench are separated by a portion of the well region; and wherein the first and the second trenches are filled with a conductive material, and wherein the conductive material is separated from the well region by a dielectric material; and a drain metal contacting the portion of the well region between the first and the second trenches to form a metal-semiconductor contact functioning as a Schottky diode, wherein the drain metal contacts the conductive material of the first and the second trenches; and wherein the first and the second trenches filled with the conductive material are configured to block a reverse leakage current of the Schottky diode.

4. The power device of claim 3, wherein the first and the second trenches have sidewalls and bottoms lined with the dielectric material.

5. The power device of claim 3, wherein the well region comprises a drain region and a source region, and wherein the gate region is disposed laterally between the drain region and the source region.

6. The power device of claim 5, further comprising a gate ohmic contact region of the first conductivity type in the gate region; and a source ohmic contact region of the second conductivity type in the source region.

7. A method of forming a power device integrating a power transistor and a Schottky diode, comprising: providing a semiconductor substrate; forming the power transistor in the semiconductor substrate, wherein forming the power transistor comprises forming a drain region, a gate region and a source region in the semiconductor substrate; forming a trench-barrier in the drain region of the power transistor, wherein forming the trench-barrier comprises forming a first trench and a second trench separated by a portion of the drain region; and wherein the trench-barrier is configured to block a reverse leakage current of the Schottky diode; and forming the Schottky diode in the drain region of the power transistor, wherein forming the Schottky diode comprises forming a drain metal to contact the portion of the drain region between the first and the second trenches of the trench-barrier; and wherein the first and the second trenches have sidewalls and bottoms, and wherein forming the trench-barrier further comprises: forming a dielectric material on the sidewalls and bottoms of the first and the second trenches; and filling the first and the second trenches with a conductive material; and wherein forming the drain metal further comprises forming an electrical contact between the drain metal and the conductive material of the first and the second trenches.

8. A method of manufacturing a power device, comprising: providing a semiconductor substrate of a first conductivity type; forming a well region of a second conductivity type on the substrate; forming a gate region of the first conductivity type in the well region; forming a first trench and a second trench in the well region, wherein the first trench and the second trench are separated by a portion of the well region;

forming a drain metal to contact the portion of the well region between the first and the second trenches so as to form a Schottky diode;

and wherein the first and the second trenches have sidewalls and bottoms, and wherein forming the first and the second trenches further comprises:

forming a dielectric material on the sidewalls and bottoms of the first and the second trenches; and filling the first and the second trenches with a conductive material, and wherein the first and the second trenches filled with the conductive material are configured to block a reverse leakage current of a Schottky diode; and wherein forming the drain metal further comprises forming an electrical contact between the drain metal and the conductive material of the first and the second trenches.

9. The method of claim 8, further comprising:

forming a drain region and a source region in the well region, wherein the drain region and the source region are laterally separated by the gate region.

10. The method of claim 9, further comprising:

forming a gate ohmic contact region of the first conductivity type in the gate region; and forming a source ohmic contact region of the second conductivity type in the source region.

* * * * *